ULTRA HIGH FREQUENCY OSCILLATION GENERATOR

Filed Feb. 5, 1945

INVENTOR
CLYDE E. HALLMARK

BY [signature]
ATTORNEY

Patented Nov. 28, 1950

2,531,426

UNITED STATES PATENT OFFICE 2,531,426

ULTRA HIGH FREQUENCY OSCILLATION GENERATOR

Clyde E. Hallmark, Fort Wayne, Ind., assignor, by mesne assignments, to Farnsworth Research Corporation, a corporation of Indiana Application February 5, 1945, Serial No. 576,288

14 Claims. (Cl. 315—6)

This invention relates to oscillators and more particularly to ultra-high frequency oscillation generators which rely on the phenomenon of secondary electron emission to provide a negative resistance characteristic.

Oscillators with a negative resistance characteristic are well known in the art. The earliest oscillator of this type is usually referred to as a dynatron oscillator. In a dynatron oscillator secondary electrons liberated from the plate of a vacuum tube are attracted by a grid kept at a higher positive potential than the plate. This connection provides a negative plate resistance because an increase of the potential of the plate will cause an increase of the secondary electron current leaving the plate. Thus, the negative resistance of the plate causes power to be delivered into a tuned circuit associated with the plate of the oscillator to sustain the oscillations.

However, in a dynatron oscillator the value of the negative plate resistance must bear a certain relationship to the load in the tuned plate circuit. The minimum negative plate resistance must be smaller than the parallel resonant impedance of the plate tank circuit. Then the amplitude of the oscillations will adjust itself so that the average negative plate resistance equals the impedance of the tank circuit. It is difficult to adjust the negative plate resistance to various conditions of the load resistance which imposes serious limitations on the fields of use of a dynatron oscillator. It would obviously be desirable to arrange an oscillator of the dynatron type in such a manner that its negative resistance may be adjusted to various loads, that is, to the impedance of the plate tank circuit.

It is an object of the present invention, therefore, to provide a novel ultra-high frequency oscillation generator employing secondary electron emission to provide a negative resistance characteristic.

Another object of the invention is to provide an oscillator employing the dynatron action where the negative resistance characteristic of the oscillator may be adjusted for various output loads.

A further object of the invention is to provide an oscillation generator where the frequency of oscillation depends upon the dimensions of tuned transmission lines forming part of the oscillator structure.

In accordance with the present invention there is provided an ultra-high frequency oscillation generator comprising a source of electrons. A secondary electron emissive member is arranged to receive electrons from the electron source. An electron collector is disposed to receive secondary electrons liberated from the secondary electron emissive member. A resonant circuit, such as for instance a transmission line, is connected to the secondary electron emissive member. Means are provided for accelerating electrons between the electron source and the secondary electron emissive member and for accelerating secondary electrons between the secondary electron emissive member and the collector. Thus, the negative resistance which exists between the electrons source and the secondary electron emissive member is utilized to deliver power into the transmission line. Finally, means are provided for deriving output energy at the resonant frequency of the transmission line.

In accordance with a preferred embodiment of the invention, an ultra-high frequency oscillation generator comprises two coaxial transmission lines, each having an open-circuited terminal and a short-circuited terminal. The transmission lines face each other with their open terminals. A secondary electron emissive member is connected to the open-circuited terminal of one of the transmission lines, while a source of electrons is disposed at the open-circuited terminal of the other one of the transmission lines to direct electrons towards the secondary electron emissive member. An electron collector is arranged to receive the secondary electrons liberated from the member. Means are provided for supplying a potential to the secondary electron emissive member that is positive with respect to the electron source, as well as means including a series impedance for supplying a potential to the collector that is positive with respect to the member. Thus, potential variations of the collector are created by the variable current flow through the series impedance. A capacitance is provided between the electron source and the collector for feeding back the potential variations of the collector to the electron source and to its associated transmission line. In this manner a positive feedback is introduced into the oscillating system which increases the negative resistance between the electron source and the secondary electron emissive member beyond that of a dynatron type oscillator. Finally, means are provided for deriving output energy at the resonant frequency of the transmission lines.

For a better understanding of the invention, together with other and further objects thereof, reference is made to the following description, taken in connection with the accompanying drawing, and its scope will be pointed out in the appended claims.

Figure 1:
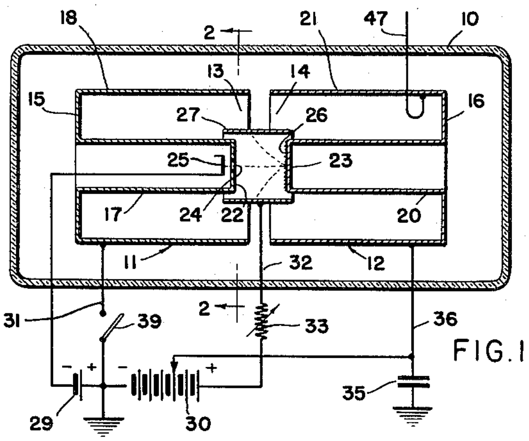
Fig. 1 is a longitudinal sectional view of an oscillator embodying the present invention.
Figure 2:
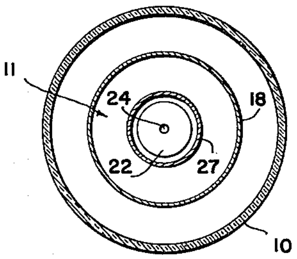
Fig. 2 is a cross-sectional view along line 2—2 of Fig. 1.

Referring now more particularly to Figs. 1 and 2 of the drawing, there is provided an oscillation generator comprising an evacuated envelope 10. Two coaxial transmission lines 11 and 12 are disposed in envelope 10 with their open-circuited terminals 13 and 14, respectively, facing each other. Coaxial transmission lines 11 and 12 each have a short-circuited terminal 15 and 16, respectively, disposed at opposite ends of envelope 10. Transmission line 11 comprises an inner conductor 17 and an outer conductor 18, while transmission line 12 includes an inner conductor 20 and an outer conductor 21. Inner conductors 17 and 20 may be hollow as shown in Fig. 1.

Inner conductor 17 is provided with plate 22 facing plate 23 of inner conductor 20. Plate 22, of inner conductor 17, is provided with aperture 24 behind which electron source 25 is arranged. Electron source 25 may, for instance, consist of a filament heated by a suitable current source, not shown in the drawing. Plate 23, of inner conductor 20, is provided with secondary electron emissive surface 26. Electron collector ring 27 disposed about inner conductor 17 is of cylindrical shape and extends up to secondary electron emissive surface 26. Preferably, the length of coaxial transmission lines 11 and 12 is equal and equivalent to one quarter of the wave length of the oscillations to be generated or an odd multiple thereof.

Secondary electron emissive surface 26 is supplied with a potential that is positive with respect to that of electron source 25 by means of battery 30 having its negative terminal grounded as shown. To this end, lead 36 connects short-circuited terminal 16 of transmission line 12 to a tap on battery 30. Short-circuited terminal 15 of coaxial transmission line 11 is connected to ground through lead 31. For the purpose of supplying a potential to electron collector ring 27 that is positive with respect to that of secondary emissive surface 26, lead 32 connects ring 27 to the positive terminal of battery 30 through resistor 33. Battery 29 having its positive terminal grounded keeps electron source 25 at a potential that is negative with respect to ground to allow the electrons to pass through aperture 24 in plate 22 which is kept at ground potential. Bypass condenser 35 is connected to lead 36 for bypassing alternating currents to ground.

Figures 3, 5:
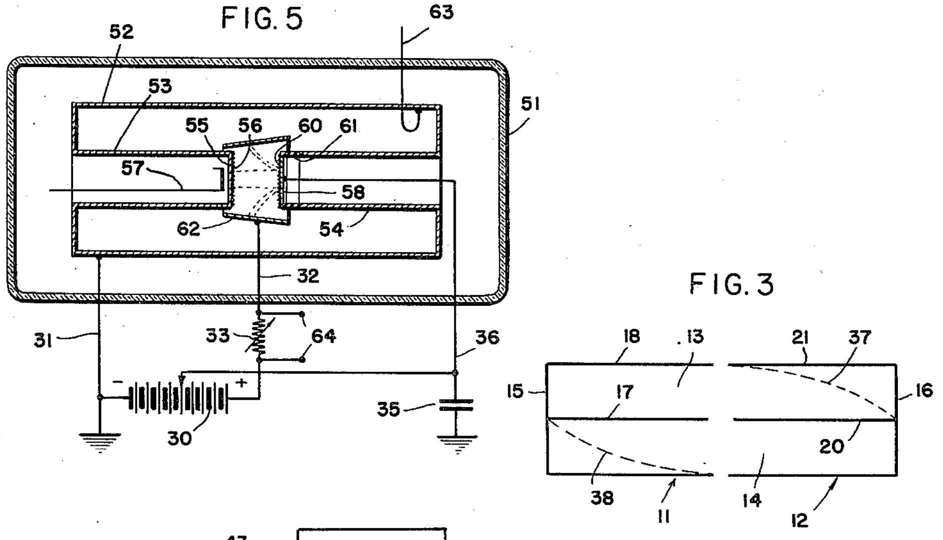
Fig. 3 is a schematic diagram of the oscillator of Fig. 1 showing the voltage distribution of the standing voltage wave at a particular instant.
Fig. 5 is a longitudinal sectional view of a modified oscillator in accordance with the invention.

The operation of the ultra-high frequency oscillation generator of the invention will be more readily understood with reference to Figs. 1, 2 and 3. Electron source 25 directs electrons through aperture 24 in plate 22 towards secondary emissive surface 26 which is kept by batteries 29 and 30 at a higher positive potential than electron source 25. The primary electrons impinging upon secondary emissive surface 26 liberate secondary electrons therefrom. The secondary electrons are collected by collector ring 27 which is kept at a still higher positive potential by means of lead 32 and battery 30.

Let it be assumed that the voltage of secondary emissive surface 26 is higher at a particular instant than its average value which may be caused, for instance, by the leading edge of a voltage surge. This voltage surge may, for example, be created by closing switch 39 in lead 31 to complete the electric circuit through battery 30. An increase of the potential of secondary emissive surface 26 will accelerate the primary electrons between source 25 and surface 26 to a higher velocity and, hence the number of secondary electrons liberated from secondary emissive surface 26 will increase. Therefore, more electrons leave secondary emissive surface 26 than impinge upon it, and consequently the potential of surface 26 is driven more positive. Thus, as is well known in the art, a negative resistance is established between surface 26 and electron source 25. The operation up to this stage is similar to that of a conventional dynatron oscillator.

Referring now to Fig. 3, there is shown a schematic representation of coaxial lines 11 and 12 including inner conductors 17, 20 and outer conductors 18, 21. Dotted line 37 represents the voltage distribution of inner conductor 20 at a particular instant. The voltage distribution of inner conductor 17 at the same time is represented by dotted line 38. As explained hereinabove, an increase of the potential of secondary emissive surface 26 above its average value will cause a still further increase of the potential thereof. This, in turn, corresponds to a larger number of secondary electrons impinging upon collector ring 27 causing, in turn, a larger current to flow through lead 32 and resistor 33 to battery 30. The larger current flowing through resistor 33 will cause a larger potential drop thereacross, driving collector ring 27 more negative. The interelectrode capacitance existing between collector ring 27 and inner conductor 17 causes a simultaneous reduction of the potential of plate 22. A drop of the potential of plate 22 is equivalent to a further rise of the potential of secondary emissive surface 26. Hence, the interelectrode capacitance between collector ring 27 and inner conductor 17 impresses the voltage drop of collector ring 27 upon inner conductor 17 and thus introduces a positive feedback into the oscillating system which, in turn, causes an increase of the negative resistance between electron source 25 and secondary emissive surface 26.

Actually, there exists also an interelectrode capacitance between collector ring 27 and inner conductor 20 which has the opposite effect of that of the interelectrode capacitance between collector ring 27 and inner conductor 17. Therefore, an interelectrode capacitance between collector ring 27 and inner conductor 20 is undesired and its effect should be minimized. This may, for instance, be accomplished as illustrated in Fig. 1 by extending the right hand portion of collector ring 27 only up to secondary emissive surface 26 so that collector ring 27 does not surround inner conductor 20.

From the above explanation it will be evident that a rise of the potential of inner conductor 20 corresponds to a reduction of the potential of inner conductor 17, as illustrated by curves 37 and 38 in Fig. 3. On the other hand, after the peak of the voltage surge occurs a reduction of the potential of secondary electron emissive surface 26 will decrease the accelerating field between electron source 25 and surface 26, and hence a smaller number of secondary electrons is now liberated. Therefore, the electron current collected by collector ring 27 decreases which causes a decrease of the potential drop across resistor 33. Accordingly, the potential of electron collector 27 increases, and the interelectrode capacitance between collector ring 27 and inner conductor 17 causes a simultaneous rise of the potential of plate 22. Thus, the accelerating potential between electron source 25 and surface 26 is further decreased.

Let it now be assumed that a voltage surge or other disturbance caused, for instance, by closing switch 39 creates an initial oscillation or transient in the oscillating system. From the previous explanation it will be seen that this initial oscillation will be magnified due to the negative resistance between electron source 25 and secondary electron emissive surface 26 and due to the positive feedback caused by the interelectrode capacitance between collector ring 27 and inner conductor 17. By virtue of this negative resistance characteristic power is delivered into transmission lines 11 and 12.

As set forth hereinabove, transmission lines 11 and 12 each have a length equivalent to one quarter of the wave length of the oscillations to be generated or an odd multiple thereof. As is well known in the art, standing waves generated in quarter wave transmission lines, such as 11 and 12, have voltage nodes at their short-circuited terminals 15 and 16 and voltage antinodes or ventral sections at their open-circuited terminals 13 and 14. Since a quarter wave transmission line with an open-circuited terminal and a short-circuited terminal is very selective, the frequency of oscillation generated in this manner is determined by the length of the two transmission lines 11 and 12. Hence, the oscillations built up in transmission lines 11 and 12 are of a frequency governed by the resonant frequency lines 11 and 12.

The amplitude of the oscillation thus generated must be limited in some manner. If, for instance, secondary electron emissive surface 26 is driven to a potential that is as high as that of collector ring 27, no electrons will be collected by collector ring 27, and thus the amplitude of the oscillations is limited by the difference in potential supplied by battery 30 to surface 26 and collector ring 27. In general, it may be said that a negative resistance characteristic is always non-linear. If the potential between the electron source and the secondary electron emissive member rises beyond a certain value, which may be of the order of magnitude of 1,000 volts, a further increase in potential will not increase but decrease the number of secondary electrons liberated. Also, when the electron current becomes too large the number of secondary electrons liberated decreases. Any one of these conditions will limit the amplitude of the oscillations generated.

As explained previously, the negative resistance between electron source 25 and secondary emissive surface 26 is increased by the reduction of the potential of plate 22 of inner conductor 17 during an increase of the potential of secondary emissive surface 26. The voltage drop of plate 22 depends upon the voltage drop of collector ring 27, conductor 17 and ring 27 being coupled through their interelectrode capacitance. The amount of the reduction of the potential of collector ring 27 depends, in turn, upon the drop of potential across resistor 33. By making resistor 33 variable, as shown in Fig. 1, the potential drop thereacross for a given current may be adjusted. In this manner the negative resistance of secondary emissive surface 26 may be changed to suit various load resistances. This is a decided advantage of the oscillator of the invention over a conventional dynatron oscillator.

Figure 4:
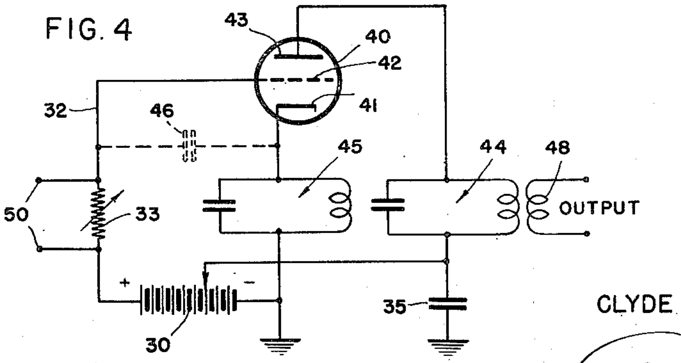
Fig. 4 is an equivalent circuit diagram of the oscillator of the invention.

The equivalent circuit diagram of the oscillator of Fig. 1 is shown in Fig. 4 and includes three-element vacuum tube 40 comprising cathode 41, grid 42 and anode 43. Cathode 41 corresponds to electron source 25 and plate 22 of Fig. 1, anode 43 corresponds to secondary emissive surface 26 of Fig. 1 and grid 42 corresponds to collector ring 27 of Fig. 1. Anode 43 is connected through parallel resonant circuit 44 to a tap of battery 30 having its negative terminal grounded. Cathode 41 is connected through parallel resonant circuit 45 to ground. Grid 42 is connected by lead 32 and resistor 33, which may be variable, to the positive terminal of battery 30. The lumped capacitance and inductance of parallel resonant circuit 44 corresponds to the distributed capacitance and inductance of coaxial transmission line 12, while the lumped capacitance and inductance of tuned circuit 45 corresponds to the distributed capacitance and inductance of coaxial transmission line 11. The interelectrode capacitance between collector ring 27 and inner conductor 17 is represented by capacitor 46 shown in Fig. 4 in dotted lines and connected between cathode 41 and grid 42.

It will be seen that the equivalent circuit of Fig. 4 is somewhat similar to that of a dynatron oscillator. Grid 42 is held by battery 30 at a higher potential than plate 43. An increase of the potential of plate 43 will cause the liberation of a larger number of secondary electrons which, in turn, drives plate 43 still more positive. The frequency of the oscillations is determined by the capacitance and inductance of tuned circuit 44. A larger current flowing through resistor 33, due to the larger number of secondary electrons liberated on plate 43, will cause a larger potential drop across resistor 33 causing a reduction of the potential of grid 42. This potential drop is impressed through capacitor 46 upon cathode 41 and thus further increases the negative resistance of plate 43.

If resonant circuit 45, corresponding to tuned transmission line 11, is omitted the oscillator of the invention will still operate. In that case capacitor 46 becomes inoperative because cathode 41 is now tied to ground, and furthermore resistor 33 may be dispensed with, in which case grid 42 is kept at a steady potential. But even then the oscillator would still be able to oscillate by virtue of the negative resistance of plate 43 caused by its secondary emissive properties. The circuit would then function as a dynatron oscillator.

The output energy at the resonant frequency of coaxial transmission lines 11 and 12 may be obtained through loop 47 coupled to short-circuited terminal 16 of transmission line 12. As explained previously, short-circuited terminal 16 has a voltage node. Since the standing current wave has a 90 degrees phase shift in space with respect to the standing voltage wave there is a current maximum or antinode at short-circuited terminal 16. As shown in Fig. 4, the output energy may be derived from inductance 48 coupled to the inductance of tuned circuit 44. Alternatively, the output energy may be derived across adjustable resistor 33 by means of terminals 50, shown in Fig. 4.

It will be seen that the oscillator of the invention has a symmetrical construction with regard to tuned transmission lines 11 and 12. Due to the fact that both transmission lines 11 and 12 are enclosed in envelope 10 the oscillator does not possess any discontinuities. The negative resistance characteristic between electron source 25 and secondary emissive surface 26 is further increased due to the feedback capacitance between inner conductor 17 and electron collector ring 27. This increase of the negative resistance between electron source 25 and electron emissive surface 26 tends to stabilize the oscillations. As the frequency of oscillation is determined by the physical length of transmission lines 11 and 12, the oscillator of the invention is particularly useful in the ultra-high frequency range.

A modification of the oscillator of the invention is illustrated in Fig. 5. The oscillator of Fig. 5 comprises evacuated envelope 51 enclosing resonant cavity 52 formed with two reentrant portions 53 and 54. Resonant cavity 52 with reentrant portions 53 and 54 corresponds to coaxial transmission lines 11 and 12 of Fig. 1, the only difference being that outer conductors 18 and 21 are connected to form a hollow cylinder. Inner conductor 53 is provided with plate 55 bearing an electron emissive surface 56 heated indirectly by filament 57 connected to a suitable current source, not shown. Inner conductor 54 is provided with plate 58 having a secondary electron emissive surface 60.

Insulating ring 61 arranged in inner conductor 54 preferably is spaced a short distance from secondary electron emissive plate 58. Insulating ring 61 preferably is made so thin that it provides a low impedance path between secondary electron emissive plate 58 and inner conductor 54 for high frequency alternating current, while blocking direct current. Collector ring 62 is of conical shape and arranged so that one of its ends closely surrounds electron emissive surface 56, while its opposite end is spaced on appreciable distance from secondary emissive plate 58 and inner conductor 54. In this manner the interelectrode capacitance between collector ring 62 and inner conductor 53 is made comparably large while the interelectrode capacitance between collector ring 62 and inner conductor 54 is minimized.

The oscillator illustrated in Fig. 5 operates in substantially the same manner as the oscillator of Figs. 1 and 2. Electron emissive surface 56 is heated by filament 57 to provide a copious electron flow. The electrons are attracted by secondary emissive surface 61 which is kept at a potential that is positive with respect to that of plate 55. For this purpose secondary emissive plate 58 is connected through lead 36 to a tap of battery 30 having its negative terminal grounded. Collector ring 62 is kept at a still higher positive potential by lead 32 connected to the positive terminal of battery 30 through variable resistor 33. The positive potential supplied by lead 36 is preferably connected to secondary emissive plate 58. Insulating ring 61 prevents the direct current supplied by lead 36 from passing to inner conductor 54 which is kept at ground potential through lead 31 connected to the outer terminal of cavity 52. The output energy may be derived from loop 63 coupled to resonant cavity 52 at a point where the standing current wave has an antinode. Alternatively, the output energy may be obtained from terminal 64 across variable resistor 33.

The electrons impinging upon secondary emissive surface 60 liberate secondary electrons therefrom which are collected by collector ring 62. In the manner explained hereinabove, standing waves are generated in reentrant portions 53 and 54 of resonant cavity 52. The frequency of oscillation is determined by the dimensions of resonant cavity 52 and reentrant portions 53 and 54. Preferably, inner conductors 53 and 54 should be of equal length equivalent to one quarter of the wave length of the oscillations to be generated or an odd multiple thereof. A resonant cavity with two reentrant portions will oscillate as is well known to those skilled in the art. Cavities of this type have been used, for instance, as resonator wavemeters and as oscillators known in the art as diode oscillators.

The equivalent circuit of the oscillator illustrated in Fig. 5 is identical to the circuit shown in Fig. 4. It is to be understood that electron source 25, shown in Fig. 1, could be used with the oscillator of Fig. 5 instead of the indirectly heated cathode structure. It may also be preferred to replace the collector ring of conical shape by collector ring 27 illustrated in Fig. 1, the only requirement being to minimize the interelectrode capacitance between collector ring 62 and inner conductor 54.

While there has been described what is at present considered the preferred embodiment of the invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. An ultra-high frequency oscillation system comprising a source of electrons, a secondary electron emissive member in the path of electrons emitted from said electron source, an electron collector in the paths of secondary electrons liberated from said member, a transmission line having an open-circuited terminal and a short-circuited terminal, one of said terminals being connected to said member, a source of potential coupled to said source and said member for accelerating electrons between said source and said member, a source of potential coupled to said member and said collector for accelerating secondary electrons between said member and said collector, thereby to deliver power into said line by virtue of the negative resistance between said source and said member, and means coupled to said transmission line for deriving output energy at the resonant frequency of said transmission line.

2. An ultra-high frequency oscillation system comprising a resonant cavity having two reentrant portions facing each other, a secondary electron emissive member connected to the free end of one of said reentrant portions, a source of electrons disposed on the free end of the other one of said reentrant portions to direct electrons towards said member, an electron collector in the path of secondary electrons liberated from said member, a source of potential coupled to said source and said member for accelerating electrons between said source and said member, a source of potential coupled to said member and said collector for accelerating secondary electrons between said member and said collector, thereby to deliver power into said resonant cavity by virtue of the negative resistance between said source and said member, and means coupled to said cavity for deriving output energy at the resonant frequency of said reentrant portions and said cavity.

3. An ultra-high frequency oscillation system comprising a resonant cavity having two reentrant portions facing each other, a secondary electron emissive member connected to the free end of one of said reentrant portions, a source of electrons disposed on the free end of the other one of said reentrant portions to direct electrons towards said member, an electron collector in the path of secondary electrons liberated from said member, a source of potential coupled to said source and said member for accelerating electrons between said source and said member, a source of potential coupled to said member and said collector for accelerating secondary electrons between said member and said collector, thereby to deliver power into said resonant cavity by virtue of the resistance between said source and said member, and a loop near the junction point of one of said reentrant portions with said cavity for deriving output energy at the resonant frequency of said reentrant portions and said cavity.

4. An ultra-high frequency oscillation system comprising a resonant cavity having two reentrant portions facing each other, a secondary electron emissive member connected to the free end of one of said reentrant portions, a source of electrons disposed on the free end of the other one of said reentrant portions to direct electrons towards said member, an electron collector in the path of secondary electrons liberated from said member, means for supplying a potential to said member that is positive with respect to said electron source, an insulating element in said reentrant portion connected to said member to insulate the potential of said member from the potential of said source, means for supplying a potential to said collector that is positive with respect to said member, thereby to deliver power into said resonant cavity by virtue of the resistance between said source and said member, and means coupled to said cavity for deriving output energy at the resonant frequency of said reentrant portions and said cavity.

5. An ultra-high frequency oscillation system comprising a source of electrons, a secondary electron emissive member in the path of electrons emitted from said electron source, an electron collector in the path of secondary electrons liberated from said member, a resonant transmission line connected to said member and having an open-circuited terminal disposed about said member and a short-circuited terminal disposed at a distance from said member, a source of potential coupled to said source and said member for accelerating electrons between said source and said member, a source of potential coupled to said member and said collector for accelerating secondary electrons between said member and said collector, thereby to deliver power into said line by virtue of the negative resistance between said source and said member, and means coupled to said transmission line for deriving output energy at the resonant frequency of said transmission line.

6. An ultra-high frequency oscillation system comprising a source of electrons, a secondary electron emissive member in the path of electrons emitted from said electron source, an electron collector disposed in the path of secondary electrons liberated from said member, a coaxial transmission line connected to said member and having an open-circuited terminal disposed about said member and a short-circuited terminal disposed at a distance from said member, a source of potential coupled to said source and said member for accelerating electrons between said source and said member, a source of potential coupled to said member and said collector for accelerating secondary electrons between said member and said collector, thereby to deliver power into said line by virtue of the negative resistance between said source and said member, and a loop adjacent said short-circuited terminal for deriving output energy at the resonant frequency of said transmission line.

7. An ultra-high frequency oscillation system comprising two transmission lines each having an open-circuited terminal and a short-circuited terminal, said transmission lines facing each other with their open terminals, a secondary electron emissive member connected to the open-circuited terminal of one of said transmission lines, a source of electrons mounted to direct electrons towards said member, an electron collector in the path of secondary electrons liberated from said member, a source of potential coupled to said source and said member for accelerating electrons between said source and said member, a source of potential coupled to said member and said collector for accelerating secondary electrons between said member and said collector, thereby to deliver power into said lines by virtue of the negative resistance between said source and said member, and means coupled to one of said transmission lines for deriving output energy at the resonant frequency of said transmission lines.

8. An ultra-high frequency oscillation system comprising two coaxial transmission lines each including a central conductor and an outer conductor, each of said transmission lines having an open-circuited terminal and a short-circuited terminal, said transmission lines facing each other with their open terminals, a secondary electron emissive member connected to the open-circuited terminal of the central conductor of one of said transmission lines, a source of electrons disposed on the open-circuited terminal of the central conductor of the other one of said transmission lines to direct electrons towards said member, an electron collector mounted adjacent said member and said source to receive secondary electrons liberated from said member, a source of potential coupled to said source and said member for accelerating electrons between said source and said member, a source of potential coupled to said member and said collector for accelerating secondary electrons between said member and said collector, thereby to deliver power into said lines by virtue of the negative resistance between said source and said member, and means coupled to said lines for deriving output energy at the resonant frequency of said transmission lines.

9. An ultra-high frequency oscillation system comprising two coaxial transmission lines each including a central conductor and an outer conductor, each of said transmission lines having an open-circuited terminal and a short-circuited terminal, said transmission lines facing each other with their open terminals, each of said transmission lines having a length equivalent to an odd number of a quarter wave length of the oscillations to be generated, a secondary electron emissive member connected to the open-circuited terminal of the central conductor of one of said transmission lines, a source of electrons disposed on the open-circuited terminal of the central conductor of the other one of said transmission lines to direct electrons towards said member, a ring-shaped electron collector mounted adjacent said member and said source to receive secondary electrons liberated from said member, a source of potential coupled to said source and said member for accelerating electrons between said source and said member, a source of potential coupled to said member and said collector for accelerating secondary electrons between said member and said collector, thereby to deliver power into said lines by virtue of the negative resistance between said source and said member, and means coupled to said lines for deriving output energy at the resonant frequency of said transmission lines.

10. An ultra-high frequency oscillation system comprising two transmission lines each having an open-circuited terminal and a short-circuited terminal, said transmission lines facing each other with their open terminals, a secondary electron emissive member connected to the open-circuited terminal of one of said transmission lines, a source of electrons mounted at the open-circuited terminal of the other one of said transmission lines to direct electrons towards said member, an electron collector in the path of secondary electrons liberated from said member, means for impressing a potential on said member that is positive with respect to said electron source, means including a series impedance for impressing a potential on said collector that is positive with respect to said member, thereby to create potential variations of said collector by the variable current flow through said impedance, a capacitance coupled between said source and said collector for feeding back the potential variations of said collector to said source and to its associated transmission line, and means coupled to said lines for deriving output energy at the resonant frequency of said transmission lines.

11. An ultra-high frequency oscillation system comprising two coaxial transmission lines each including a central conductor and an outer conductor, said outer conductors being connected together, said central conductors facing each other, a secondary electron emissive member connected to one of said central conductors, a source of electrons mounted on the other one of said central conductors to direct electrons towards said member, an electron collector in the path of secondary electrons liberated from said member, means for impressing a potential on said member that is positive with respect to said electron source, an insulating element in said central conductor connected to said member to insulate the potential of said member from the potential of said source, means including a series impedance for impressing a potential on said collector that is positive with respect to said member, thereby to create potential variations of said collector by the variable current flow through said impedance, a capacitance coupled between said source and said collector for feeding back the potential variations of said collector to said source and to its associated transmission line, and means coupled to said lines for deriving output energy at the resonant frequency of said transmission lines.

12. An ultra-high frequency oscillation system comprising two coaxial transmission lines each having an open-circuited terminal and a short-circuited terminal, said transmission lines facing each other with their open terminals, a secondary electron emissive member connected to the open-circuited terminal of one of said transmission lines, a source of electrons mounted at the open-circuited terminal of the other one of said transmission lines to direct electrons towards said member, an electron collector mounted adjacent said member and said source to receive secondary electrons liberated from said member, means for impressing a potential on said member that is positive with respect to said electron source, means including a series impedance for impressing a potential on said collector that is positive with respect to said member, thereby to create potential variations of said collector by the variable current flow through said impedance, a capacitance coupled between said source and said collector for feeding back the potential variations of said collector to said source and to its associated transmission line, and a loop coupled to one of said short-circuited terminals for deriving output energy at the resonant frequency of said transmission lines.

13. An ultra-high frequency oscillation generator tube comprising two coaxial transmission lines each including a central conductor and an outer conductor, each of said transmission lines having an open-circuited terminal and a short-circuited terminal, said transmission lines facing each other with their open terminals, a secondary electron emissive member connected to the open-circuited terminal of the central conductor of one of said transmission lines, a source of electrons disposed on the open-circuited terminal of the central conductor of the other one of said transmission lines to direct electrons towards said member, and an electron collector mounted adjacent said member and said source to receive secondary electrons liberated from said member.

14. An ultra-high frequency oscillation generator tube comprising two coaxial transmission lines each including a central conductor and an outer conductor, each of said transmission lines having an open-circuited terminal and a short-circuited terminal, said transmission lines facing each other with their open terminals, each of said transmission lines having a length equivalent to an odd number of a quarter wave length of the oscillations to be generated, a secondary electron emissive member connected to the open-circuited terminal of the central conductor of one of said transmission lines, a source of electrons disposed on the open-circuited terminal of the central conductor of the other one of said transmission lines to direct electrons towards said member, and a ring-shaped electron collector mounted adjacent said member and said source to receive secondary electrons liberated from said member.

CLYDE E. HALLMARK.

REFERENCES CITED

The following references are of record in the file of this patent:

UNITED STATES PATENTS

| Number | Name | Date |
|---|---|---|
| 1,937,512 | Dow | Dec. 5, 1933 |
| 2,114,114 | Roberts | Apr. 12, 1938 |
| 2,116,996 | Crawford | May 10, 1938 |
| 2,159,521 | Farnsworth | May 23, 1939 |
| 2,216,169 | George et al. | Oct. 1, 1940 |
| 2,272,211 | Kohler | Feb. 10, 1942 |
| 2,323,201 | Carter | June 29, 1943 |

FOREIGN PATENTS

| Number | Country | Date |
|---|---|---|
| 538,983 | Germany | Nov. 20, 1931 |